United States Patent [19]

Sharrow

[11] 4,284,946

[45] Aug. 18, 1981

[54] FAILURE MONITOR FOR CRYSTAL FILTERS

[75] Inventor: John A. Sharrow, Ft. Lauderdale, Fla.

[73] Assignee: The Bendix Corporation, Southfield, Mich.

[21] Appl. No.: 50,009

[22] Filed: Jun. 18, 1979

[51] Int. Cl.³ .............................................. G01R 29/22

[52] U.S. Cl. ............................... 324/56; 324/DIG. 1; 324/62

[58] Field of Search .................. 324/56, 62 R, DIG. 1

[56] References Cited

U.S. PATENT DOCUMENTS

| | | | |
|---|---|---|---|
| 3,568,044 | 3/1971 | Elazar | 324/62 R |
| 3,588,690 | 6/1971 | Griffin | 324/56 |
| 3,786,350 | 1/1974 | Munt | 324/62 |

*Primary Examiner*—Michael J. Tokar

*Attorney, Agent, or Firm*—W. G. Christoforo; Bruce L. Lamb

[57] ABSTRACT

A comparator has one input terminal connected to a reference voltage terminal and a second input terminal connected to sense the voltage on the resonator structure of a crystal filter. In the event the voltage on the resonator structure changes, such as by failure of the ground connection, the comparator generates an output signal indicating crystal filter failure.

3 Claims, 3 Drawing Figures

FAILURE MONITOR FOR CRYSTAL FILTERS

This invention relates to crystal filters and more particularly to simple monitors for detecting failure thereof.

BACKGROUND OF THE INVENTION

Piezoelectric quartz crystals used as bandpass filters provide a simple means for obtaining high selectivity in the i.f. sections of radio receivers primarily because of their extremely high Q ratings. Such filters generally include a resonator structure disposed on surface of the quartz. The high Q rating of such filters practically eliminate any audio frequency imaging problems while also providing good discrimination against adjacent signals and reducing broadband noise. In addition to the operational advantages and ease of use of crystal filters, they are also economically attractive.

In spite of the many advantages of crystal filters, their use in certain radio applications has been resisted because of the failure modes experienced by such filters. Specifically, monolithic crystal filters are prone to three types of failure modes:

A. Failure of input or output impedance matching networks

B. Failure of a resonator

C. Failure of the ground connection to a resonator.

Although failures in modes A or B result in an increased insertion loss and a moderate bandpass ripple, such failures are not catastrophic so long as the signal strengths are high enough to provide coupling through the failure. More particularly, if such filters are used in an aircraft instrument landing system receiver and fail in modes A or B, the minimum resulting distortion of the received signal permits its use in the instrument landing system in high signal areas with full confidence. However, failure of such filters in mode C result in severe bandpass ripple, causing distortion of the signals applied to the filters and altering the signal modulation sidebands. Failure mode C is particularly serious in instrument landing systems since the increased signal distortion caused by the loss of the resonator ground connection can cause the received signal to fall into erroneous areas of the passband to thus alter the difference in the depth of signal modulation. As known to those skilled in the instrument landing system arts, the difference in the depth of signal modulation is a measure of the aircraft deviation from the approach glide path, thus any alteration of the difference in the depth of signal modulation caused by failure in the circuitry of the instrument landing system receiver can result in dangerously erroneous aircraft position information being displayed to the pilot.

It has been suggested that mode C failures be prevented by a double grounding technique wherein the filter resonator is grounded through two separate and independent paths in the belief that it is highly unlikely that both grounds would fail before repairs could be effected. However, because of the small size of such filters and the manner in which they are packaged in protective enclosures, there is no convenient way to determine whether one of the ground connections has failed without disassembling the filter. Thus, this method of mode C failure protection is impractical.

SUMMARY OF THE INVENTION

The present invention comprises a failure monitor which provides an immediate and reliable indication of the failure of the ground connection to a resonator of a crystal filter and thus has particular use in sensitive applications such as in instrument landing system receivers. In the embodiment to be described the invention comprises simply a comparator circuit, one input of which is a reference voltage and the other input of which is connected into the ground pattern of the monolithic crystal filter. Interruption of the filter ground circuit will alter the comparator input signals and cause a failure signal, in the form of a comparator output signal, to be generated.

It is thus an object of this invention to provide a simple but reliable means to monitor the integrity of a crystal filter ground connection.

This and other objects of the invention will become apparent from a reading and understanding of the following description of my preferred embodiment of the invention.

DESCRIPTION OF THE PREFERRED EMBODIMENT

Figure 1:
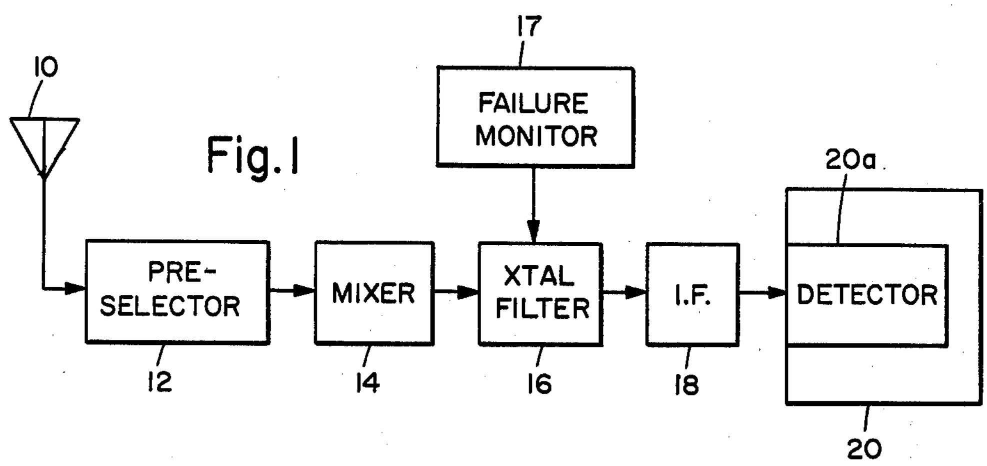
FIG. 1 is a simple block diagram showing the invention used in an instrument landing system receiver.

Referring first to FIG. 1 an instrument landing system receiver for an aircraft is comprised generally of a front end having an antenna 10, preselector 12 and mixer 14 serially connected, an i.f. section 18 and the audio circuits 20 including a detector **20*a*. A bandpass crystal filter 16 which is generally considered to be part of the i.f. circuits, is interposed at the input to i.f. section 18. The crystal filter, because of its extremely high Q, provides excellent bandpass characteristics in discriminating against signals outside the desired passband. The failure monitor 17 of the invention is connected into the ground circuits of crystal filter 16**.

Figure 2:
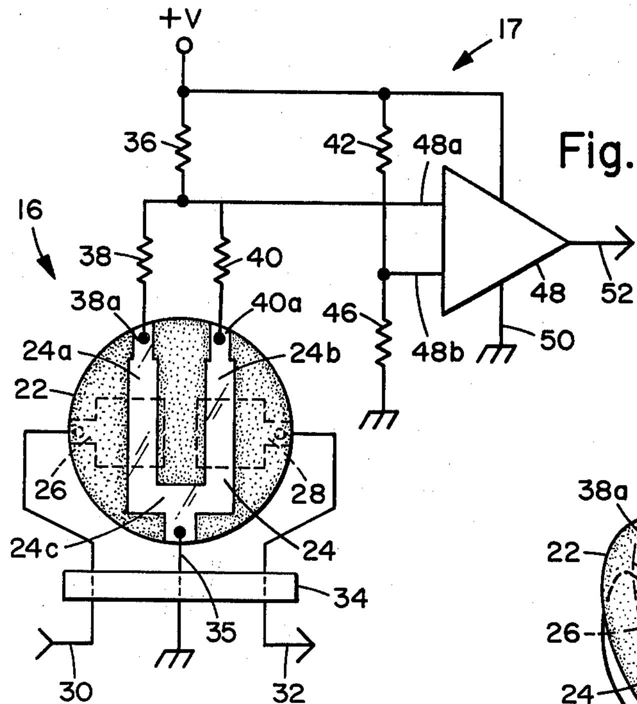
FIG. 2 is a schematic of the preferred embodiment of the invention together with a crystal filter.

Referring now to FIG. 2 the failure monitor 17, seen in schematic format, is connected into the ground circuits of the resonator 24 of crystal filter 16. Crystal filters of the type shown are well known to those skilled in the art. Briefly, the crystal filter 16 is comprised of a thin quartz disc 22 having a resonator structure 24 metallically plated on one surface thereof. As can be seen, the resonator is a horseshoe shaped structure comprised of parallel legs **24*a* and 24*b* and connecting segment 24*c*. Metallically plated on the opposite side of disc 22, so as to be seen here in dashed outline, are two pads 26 and 28 which respectively underlie and capacitively couple through the quartz disc to legs 24*a* and 24*b*. Disc 22 is mounted to a header 34 through leads 30, 32 and 35 which in addition to providing physical support for disc 22 on header 34, respectively, supply the input signal to pad 26, tap the output signal from pad 28, and provide a ground connection for resonator structure 24 at connecting segment 24*c***.

Failure monitor 17 is comprised of an operational amplifier 48 connected as a comparator having an inverting input terminal **48*a* connected through resistor 38 to one end 38*a* of resonator structure 24 and through resistor 40 to another end 40***a* of resonator structure 24. Terminal 48*a* is also connected through resistor 36 to a positive voltage terminal, the negative voltage terminal of the same source comprising the ground connection on lead 35. The non-inverting input terminal 48*b* of operational amplifier 48 is connected through resistor 42 to the positive voltage terminal and through resistor 46 to the negative or ground voltage terminal. The voltage at input terminal 48*b* thus is a comparator reference voltage.

It can be seen that in the event ground connection to the resonator fails the voltage at input terminal 48*a* goes high, thus causing operational amplifier 48 to generate a negative-going output signal on line 52, thereby indicating failure of the crystal filter. A standard indicator of the type known in the art can be provided to display the failure to the cockpit personnel. Loss of resonator ground can occur in a number of ways such as by interruption of lead 35 either along its length or at its attachment points. Also, a break in either leg 24*a* or 24*b*, although not a complete loss of the resonator ground connection, is sensed by failure resonator 17 because of loss of one of the parallel current paths comprised of legs 24*a* and 24*b*. This, of course, also causes the voltage at input terminal 48*a* to increase and to cause operational amplifier 48 to generate the failure output signal.

The d.c. voltage and the resistors comprising failure monitor 17 are chosen such that only a small d.c. ground current flows in resonator structure 24. This small d.c. current has no discernible effect on the normal operation of filter 16. For example, in the embodiment actually built the d.c. voltage is 12 volts, resistors 38 and 40 are each 1 K ohms, resistors 36 and 42 are each 10 K ohms and resistor 46 is 750 ohms.

Figure 3:
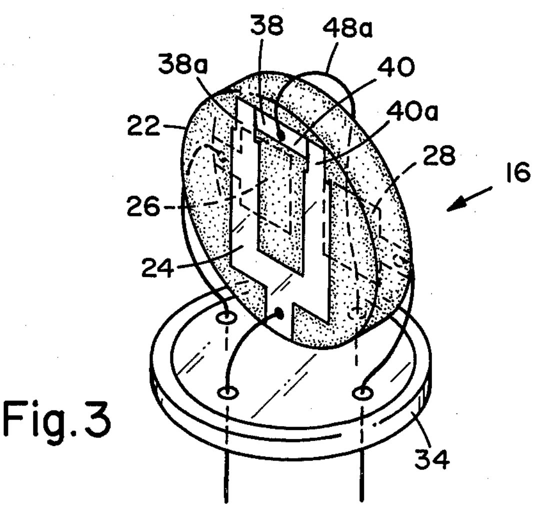
FIG. 3 shows the preferred physical arrangement of the crystal filter.

Referring now to FIG. 3, the preferred arrangement of filter 16 is with resistors 38 and 40 of the schematic of FIG. 2 deposited on the surface of quartz disc 22 between ends 38*a* and 40*a* of resonator structure 24. This permits a single additional lead, which comprises terminal 48*a* of FIG. 2, to communicate the crystal filter with the failure monitor. Of course, in packaging the configuration of FIG. 2, a lead through the header is required for each resonator leg. In those applications where a lower level of integrity is permitted a single lead through the header of FIG. 2 can be used. However, of course, in that case although the integrity of the ground connection to the resonator is continuously monitored, only the integrity of that part of the resonator structure to which the single lead is connected is monitored. A lower level of integrity is also provided if in the structure of FIG. 3 deposited resistors 38 and 40 are replaced by a conductive track. In that case both legs of the resonator structure or the ground lead thereto must fail to cause the failure output signal to be generated. Other modifications and alterations to the invention will now suggest themselves to one skilled in the art without departing from the teachings of this disclosure. Accordingly, I claim as my invention the subject matter encompassed by the true spirit and scope of the appended claims.

The invention claimed is:

1. In a crystal filter comprising a piezoelectric means having a surface on which an electrically conductive resonator structure is plated and electrically connected to one terminal of a voltage source, said resonator structure being horseshoe shaped having parallel legs and a connecting segment, said resonator structure being connected to said one terminal at said connecting segment, means for monitoring the integrity of the resonator structure and of the electrical connection between said resonator structure and said one terminal comprising:

a comparator having first and second input terminals;

means for impressing a reference voltage on said first input terminal;

a resistive voltage divider network connected between the other terminal of said voltage source and said resonator structure and having an intermediate tap connected to said second input terminal, said resistive voltage divider network having parallel arms respectively connected to the parallel legs of said resonator structure.

2. The means for monitoring of claim 1 wherein at least one of the resistors comprising said resistance voltage divider network is plated on the surface of said piezoelectric means.

3. The means for monitoring of claim 1 wherein said parallel arms are plated on the surface of said piezoelectric means in the form of a single plated resistor spanning the open end of the horseshoe shaped resonator structure, said second input terminal being a point on said single plated resistor intermediate said parallel legs.

* * * * *